United States Patent
Liang et al.

(10) Patent No.: US 7,589,965 B2
(45) Date of Patent: Sep. 15, 2009

(54) THERMAL MODULE AND ELECTRONIC ASSEMBLY INCORPORATING THE SAME

(75) Inventors: Shang-Chih Liang, Taipei Hsien (TW); Jui-Wen Hung, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 35 days.

(21) Appl. No.: 11/746,607

(22) Filed: May 9, 2007

(65) Prior Publication Data

US 2008/0151500 A1    Jun. 26, 2008

(30) Foreign Application Priority Data

Dec. 20, 2006   (CN)   .................. 2006 1 0157714

(51) Int. Cl.
*H05K 7/20*   (2006.01)
*F28F 7/00*   (2006.01)

(52) U.S. Cl. .................. 361/695; 165/104.33; 165/122; 361/694; 361/715

(58) Field of Classification Search ............ 165/104.33; 361/687, 694, 695, 700
See application file for complete search history.

(56) References Cited

U.S. PATENT DOCUMENTS

| | | | |
|---|---|---|---|
| 7,254,083 B2 * | 8/2007 | Beckert et al. .............. | 365/228 |
| 7,289,324 B2 * | 10/2007 | Yu ............................... | 361/697 |
| 7,447,030 B2 * | 11/2008 | Hwang et al. ................ | 361/700 |
| 7,460,370 B2 * | 12/2008 | Cheng et al. ................. | 361/700 |
| 7,474,526 B2 * | 1/2009 | Fujiwara ................ | 165/104.21 |
| 2003/0081382 A1 * | 5/2003 | Lin ........................... | 361/697 |
| 2004/0001316 A1 * | 1/2004 | Kamikawa et al. .......... | 361/700 |
| 2004/0201958 A1 | 10/2004 | Lev | |
| 2004/0257764 A1 * | 12/2004 | Jang ........................... | 361/687 |
| 2007/0029071 A1 * | 2/2007 | Hwang et al. .......... | 165/104.33 |
| 2007/0251676 A1 * | 11/2007 | Cheng et al. ........... | 165/104.33 |
| 2007/0279866 A1 * | 12/2007 | Cheng et al. ................. | 361/700 |
| 2008/0023176 A1 * | 1/2008 | Peng et al. ................. | 165/80.3 |
| 2008/0043436 A1 * | 2/2008 | Hung et al. ................. | 361/700 |

* cited by examiner

*Primary Examiner*—Gregory D Thompson
(74) *Attorney, Agent, or Firm*—Frank R. Niranjan

(57) ABSTRACT

An electronic assembly includes a casing (10) of an electronic product, and a thermal module disposed in the casing. The casing has a sidewall (102) defining a plurality of slots (1011) therein. The thermal module includes a centrifugal blower (50), a fin assembly (40) and a plurality of sub-fins (701). The centrifugal blower defines an air outlet (502) therein. The fin assembly is disposed at the air outlet of the centrifugal blower and includes a plurality of fins (401) and has a plurality of air passages (402) formed between adjacent fins. The sub-fins are located between the fin assembly and the sidewall of the casing, and forming a plurality of air channels (702) therebetween. The air channels of the sub-fins communicate the air passages of the fin assembly with the slots of the sidewall of the casing.

19 Claims, 8 Drawing Sheets

US 7,589,965 B2

THERMAL MODULE AND ELECTRONIC ASSEMBLY INCORPORATING THE SAME

BACKGROUND OF THE INVENTION

1. Field of the Invention

The present invention relates to thermal module, and more particularly to a thermal module having high heat dissipating efficiency and an electronic assembly incorporating the thermal module.

2. Description of Related Art

Thermal modules are traditionally used in micro-electronics to help transfer heat from heat generating electronic components of the micro-electronics. The thermal module is mounted to a casing of the micro-electronics and includes a centrifugal blower, a fin assembly disposed at an air outlet of the centrifugal blower, a heat pipe thermally connecting the heat generating electronic component with the fin assembly to transfer heat therebetween. In operation of the thermal module, the centrifugal blower generates airflow flowing through the fin assembly to take away heat therefrom.

In the micro-electronics, the fin assembly is located adjacent to a sidewall of the casing of the micro-electronics. The sidewall of the casing defines a plurality of slots therein and includes a plurality of barriers arranged in alternating fashion with the slots. Conventionally, fins of the fin assembly are thin in construction and are arranged close together in order to increase the heat dissipating area of the thermal module. However, as density of the barriers of the casing is smaller than the density of the fins of the fin assembly and a thickness of each of the barriers of the casing is greater than the thickness of each of the fins of the fin assembly, some part of the air flowing towards the sidewall of the casing from the fin assembly is blocked by the barriers of the casing when the fin assembly is located adjacent to the sidewall of the casing. The blockage of the air by the barriers decreases the heat dissipating efficiency of the thermal module. Thus, the fin assembly is positioned distant from the sidewall of the casing in order to prevent the airflow from being blocked by the barriers. However, different parts of the airflow mix with each other and therefore generating air turbulence in a space formed between the fin assembly and the sidewall of the casing. The air turbulence decreases flow speed of the airflow and further decreases the heat dissipating efficiency of the thermal module. Therefore, there is a need for providing a thermal module with a high dissipating efficiency.

SUMMARY OF THE INVENTION

The present invention relates, in one respect, to a thermal module having a high heat dissipating efficiency. The thermal module includes a centrifugal blower, a fin assembly and a plurality of sub-fins. The centrifugal blower has a bottom housing defining an air outlet therein. The fin assembly is disposed at the air outlet of the centrifugal blower and has a plurality of fins forming a plurality of air passages therebetween. The sub-fins are integrally formed with the bottom housing of the centrifugal blower from a single piece. Each of the sub-fins has an inner side connecting with a corresponding fin of the fin assembly and an outer side distant from the fin assembly. A plurality of air channels are formed between adjacent sub-fins and communicate with the air passages of the fin assembly.

The present invention relates, in another respect, to an electronic assembly incorporating the thermal module. The electronic assembly includes a casing of an electronic product, and a thermal module disposed in the casing of the electronic product. The casing of the electronic product has a base wall and a sidewall connected with the base wall. The sidewall defines a plurality of slots therein and includes a plurality of barriers alternating with the slots. The thermal module includes a centrifugal blower, a fin assembly and a plurality of sub-fins. The centrifugal blower has a bottom housing defining an air outlet facing towards the slots of the sidewall. The fin assembly is disposed at the air outlet of the centrifugal blower. The fin assembly includes a plurality of fins and has a plurality of air passages formed between adjacent fins. The sub-fins are located between the fin assembly and the sidewall of the casing of the electronic product, and form a plurality of air channels therebetween. The air channels of the sub-fins communicate the air passages of the fins of the fin assembly with the slots of the sidewall of the casing.

Other advantages and novel features of the present invention will become more apparent from the following detailed description of preferred embodiments when taken in conjunction with the accompanying drawings, in which:

DETAILED DESCRIPTION OF THE INVENTION

Figure 1:
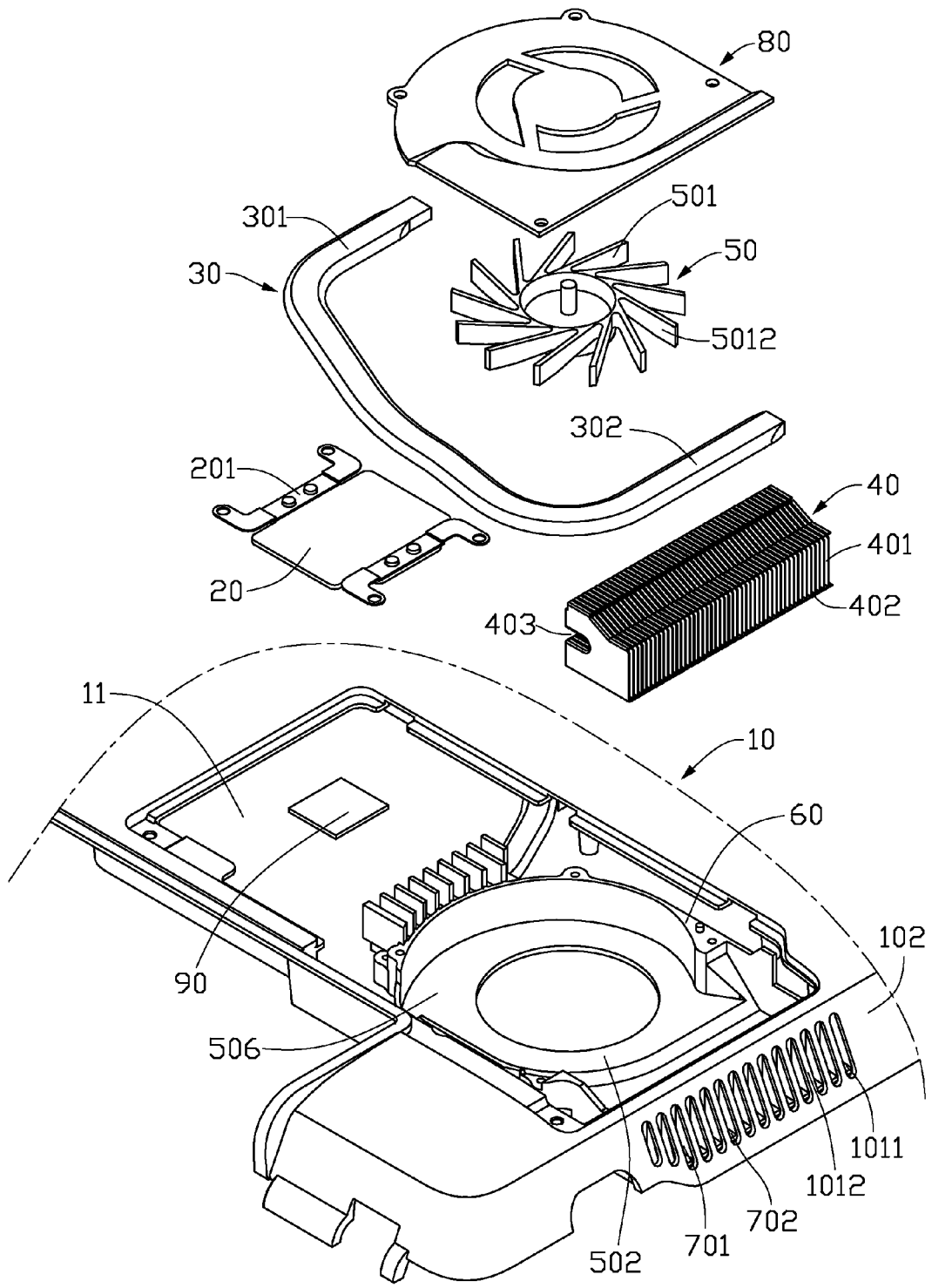
FIG. 1 is an exploded, isometric view of an electronic assembly in accordance with a first embodiment of the present invention.
Figure 2:
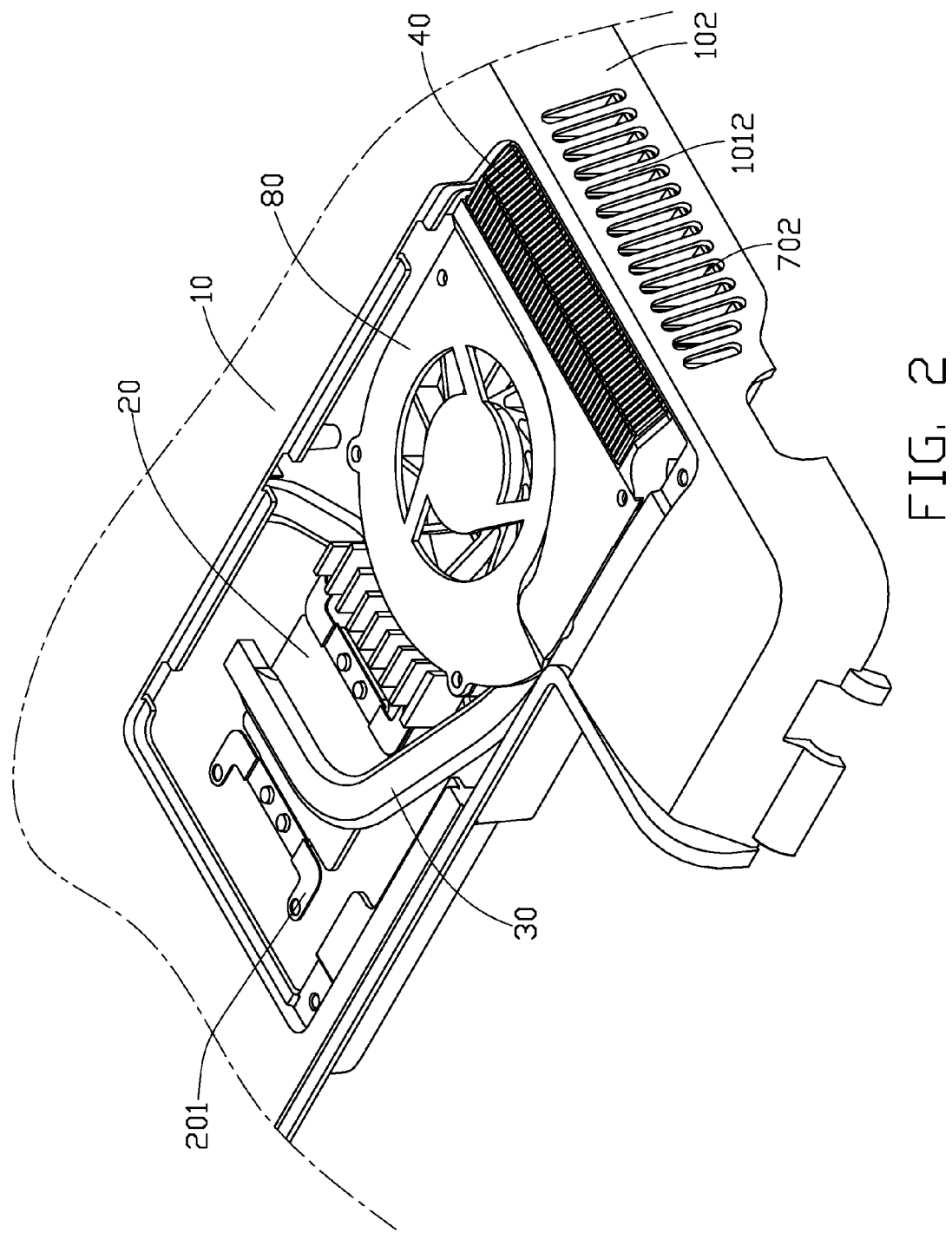
FIG. 2 is an assembled view of the electronic assembly of FIG. 1.

Referring to FIGS. 1 and 2, an electronic assembly according to a preferred embodiment of the present invention is shown. The electronic assembly includes a portable electronic product having a casing 10 and a thermal module mounted in the casing 10. The portable electronic product may be a laptop computer, or a DVD player. The thermal module includes a heat spreader 20, a flattened heat pipe 30, a centrifugal blower 50 and a fin assembly 40.

The heat spreader 20 is mounted on a heat generating electronic component 90 via two resilient clips 201. The heat pipe 30 has a C-shaped configuration, and has an evaporation section 301 thermally connecting with the heat spreader 20 and a condensation section 302 thermally connecting with the fin assembly 40 to transfer heat therebetween.

Figure 3:
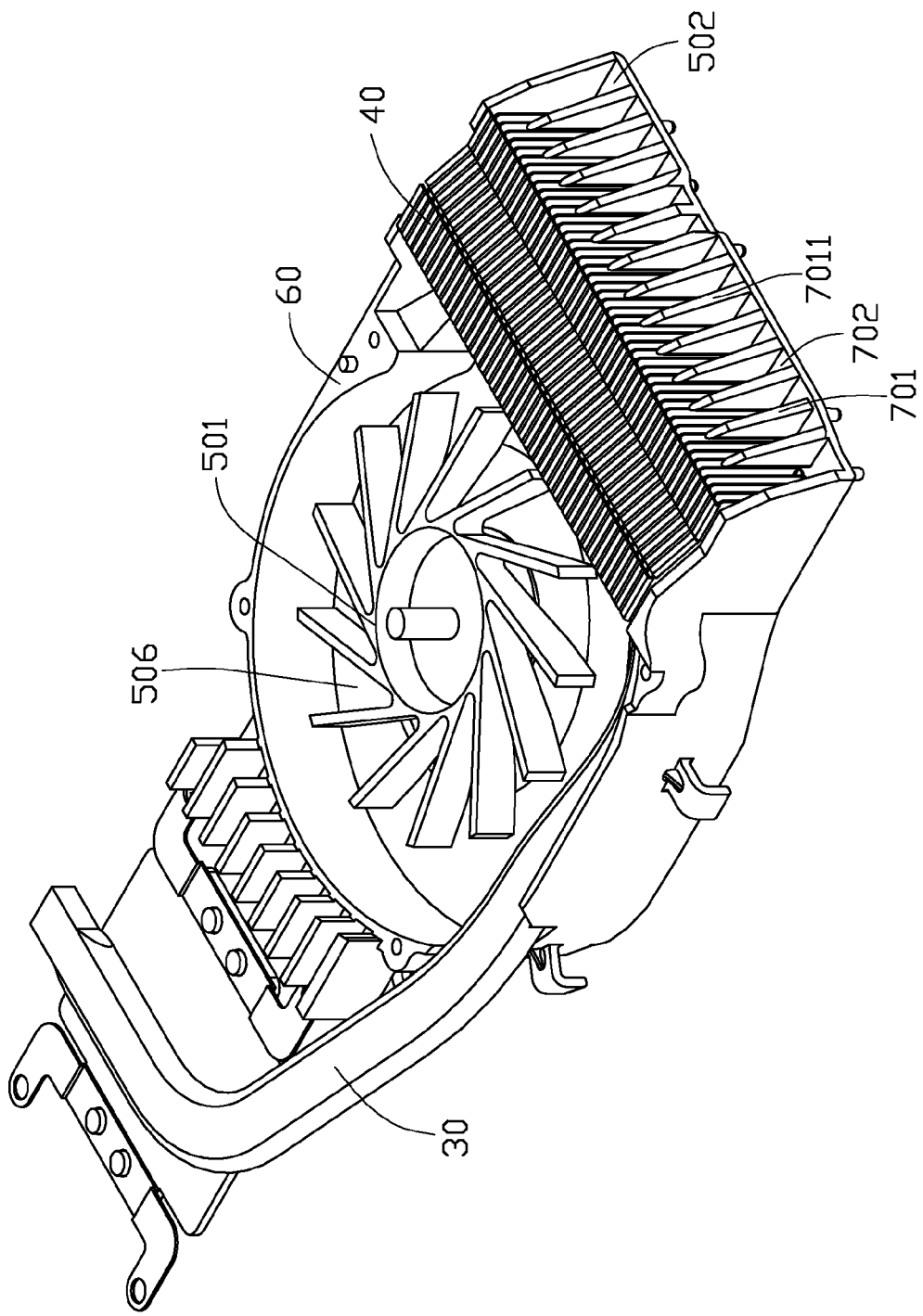
FIG. 3 is a partly assembled view of a thermal module of the electronic assembly of FIG. 1.
Figure 4:
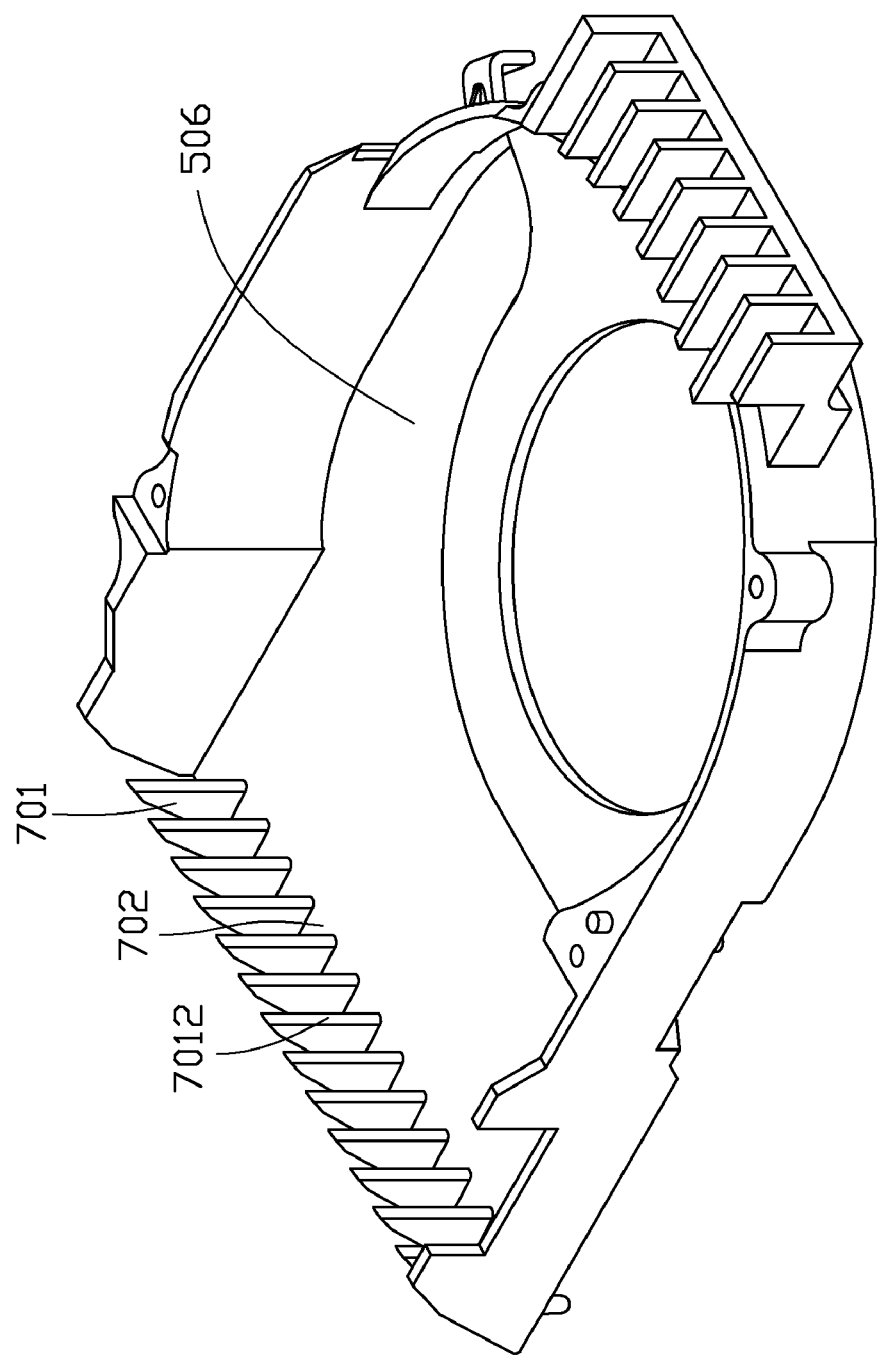
FIG. 4 is an isometric view of a bottom housing of a centrifugal blower of the thermal module of FIG. 3.
Figure 5:
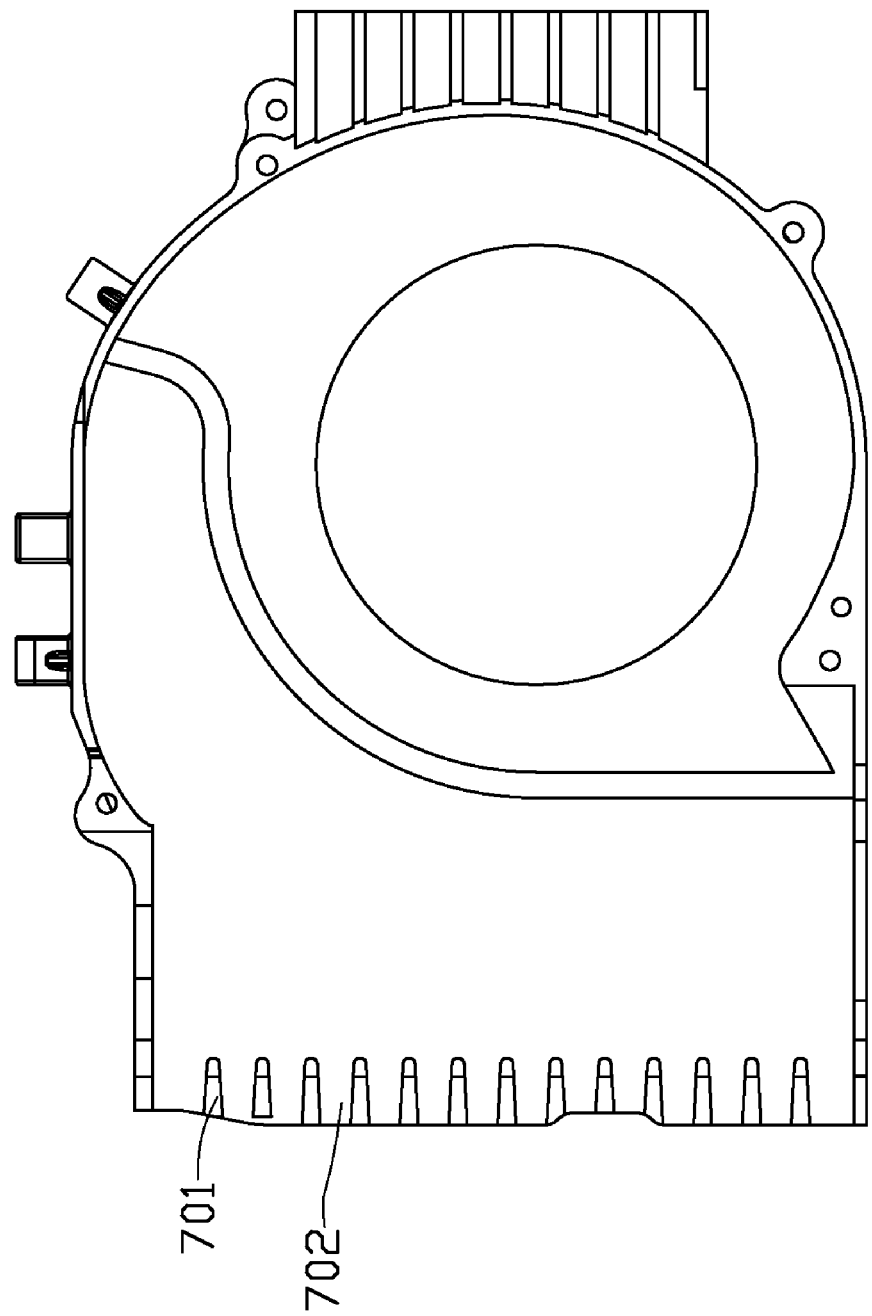
FIG. 5 is a top-down view of the bottom housing of FIG. 4.

The centrifugal blower 50 includes a bottom housing 60, a top lid 80 covering the bottom housing 60, a stator (not shown) disposed in a space cooperatively enclosed by the bottom housing 60 and the top lid 80, and a rotor 501 rotatably disposed around the stator. The bottom housing 60 is integrally formed with the casing 10 of the electronic product from a single piece and defines an air outlet 502 at a side thereof. Particularly referring to FIGS. 3 through 5, a plurality of sub-fins 701 extends from a base wall 506 of the bottom housing 60 of the centrifugal blower 50. The centrifugal blower 50 is located at an end of a base wall 11 (shown in FIG. 1) of the casing 10 of the electronic product. A plurality of air channels 702 are formed between adjacent sub-fins 701. The sub-fins 701 are integrally formed with the base wall 506 of the bottom housing 60 of the centrifugal blower 50 and the base wall 11 of the casing 10 of the electronic product from a single piece. Alternatively, the base wall 11 of the casing 10 of the electronic product may be separately formed with the base wall 506 of the bottom housing 60 of the centrifugal blower 50. The sub-fins 701 may be integrally formed with the base wall 506 of the bottom housing 60 of the centrifugal blower 50 from a single piece. The sub-fins 701 may also be separately formed from the base wall 506 of the bottom housing 60 of centrifugal blower 50 and then soldered or adhered thereto. Each of the sub-fins 701 has a right-angled triangular configuration, and includes a vertical inner side 7012 (shown in FIG. 4) perpendicular to the base wall 506 of the bottom housing 60 of the centrifugal blower 50 and a slantwise outer side 7011 (shown in FIG. 3) forming an acute angle with the base wall 506 of the bottom housing 60. A thickness of the sub-fin 701 gradually decreases from the outer side 7011 towards the inner side 7012 thereof.

Referring to FIGS. 1 and 2, the fin assembly 40 is mounted to an air outlet 502 of the centrifugal blower 50. The fin assembly 40 includes a plurality of stacked fins 401 and a plurality of air passages 402 formed between main bodies of adjacent fins 401. The fin assembly 40 is arranged between the sub-fins 701 and blades 5012 of the rotor 501 of the centrifugal blower 50, with outer sides of some of the fins 401 contacting with the inner sides 7012 of the sub-fins 701. Each of the fins 401 defines a U-shaped cutout 403 in a middle portion thereof. The cutout 403 is arranged at an inner side of the fin 401 and is adjacent to free ends of the blades 5012 of the rotor 501 of the centrifugal blower 50. The cutouts 403 of the fins 401 of the fin assembly 40 cooperatively form a groove, receiving the condensation section 302 of the heat pipe 30 therein.

The casing 10 of the electronic product includes a sidewall 102 disposed adjacent to the air outlet 502 of the centrifugal blower 50. The sidewall 102 of the casing 10 slantingly extends from and forms an acute angle to the base wall 11 of the casing 10. The sidewall 102 defines a plurality of parallel slots 1011 therein so that a plurality of air guiding barriers 1012 are formed in the sidewall 102 between the slots 1011. The acute angle formed between the sidewall 102 and the base wall 11 of the casing 10 of the electronic product substantially equals that formed between the outer side 7011 of the sub-fin 701 and the base wall 506 of the bottom housing 60 of the centrifugal blower 50. The outer side 7011 of the sub-fin 701 has an intimate contact with a corresponding air guiding barrier 1012 of the sidewall 102 of the casing 10 of the electronic product. A width of the air guiding barrier 1012 substantially equals the thickness of the outer side 7011 of the sub-fin 701, whilst a width of the slot 1011 essentially equals a width of an outer end of the air channel 702 of the sub-fins 701. A width of the air channel 702 gradually increases from the outer end towards an inner end thereof. A width of the inner end of the air channel 702 substantially equals to a multiple of a width of the air passage 402 of the fins 401 of the fin assembly 40. In this embodiment, the width of the inner end of the air channel 702 equals to three times the width of the air passage 402 of the fins 401 of the fin assembly 40. Air flowing from three adjacent air passages 402 of the fins 401 of the fin assembly 40 smoothly enters into one corresponding air channel 702 of the sub-fins 701 and then through the corresponding slot 1011 of the sidewall 102 of the casing 10 of the electronic product, thereby dissipating the heat generated by the heat generating electronic component 90 towards the surrounding environment.

In the present thermal module, the sub-fins 701 and the air guiding barriers 1012 guide the airflow evenly and smoothly flowing through the air channels 702 and the slots 1011 towards the surrounding environment. The airflow in a space formed between the fin assembly 40 of the thermal module and the sidewall 102 of the casing 10 of the electronic product is guided by the sub-fins 701. This prevents different parts of the airflow from mixing with each other and further prevents air turbulence from being generated in the space. Therefore, the heat dissipating efficiency of the thermal module is increased.

Figure 6:
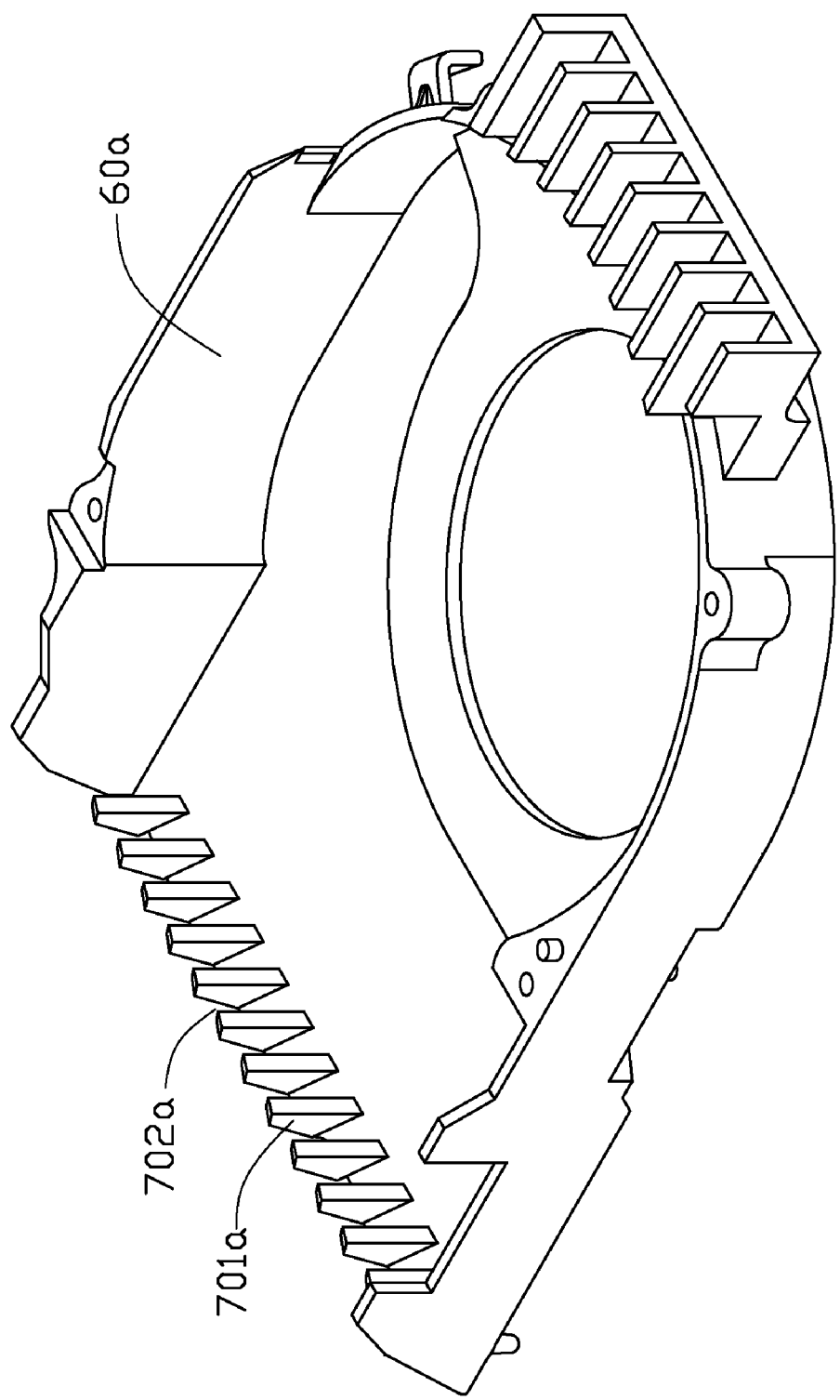
FIG. 6 is an isometric view of a bottom housing of a centrifugal blower according to a second embodiment of the present invention.
Figure 7:
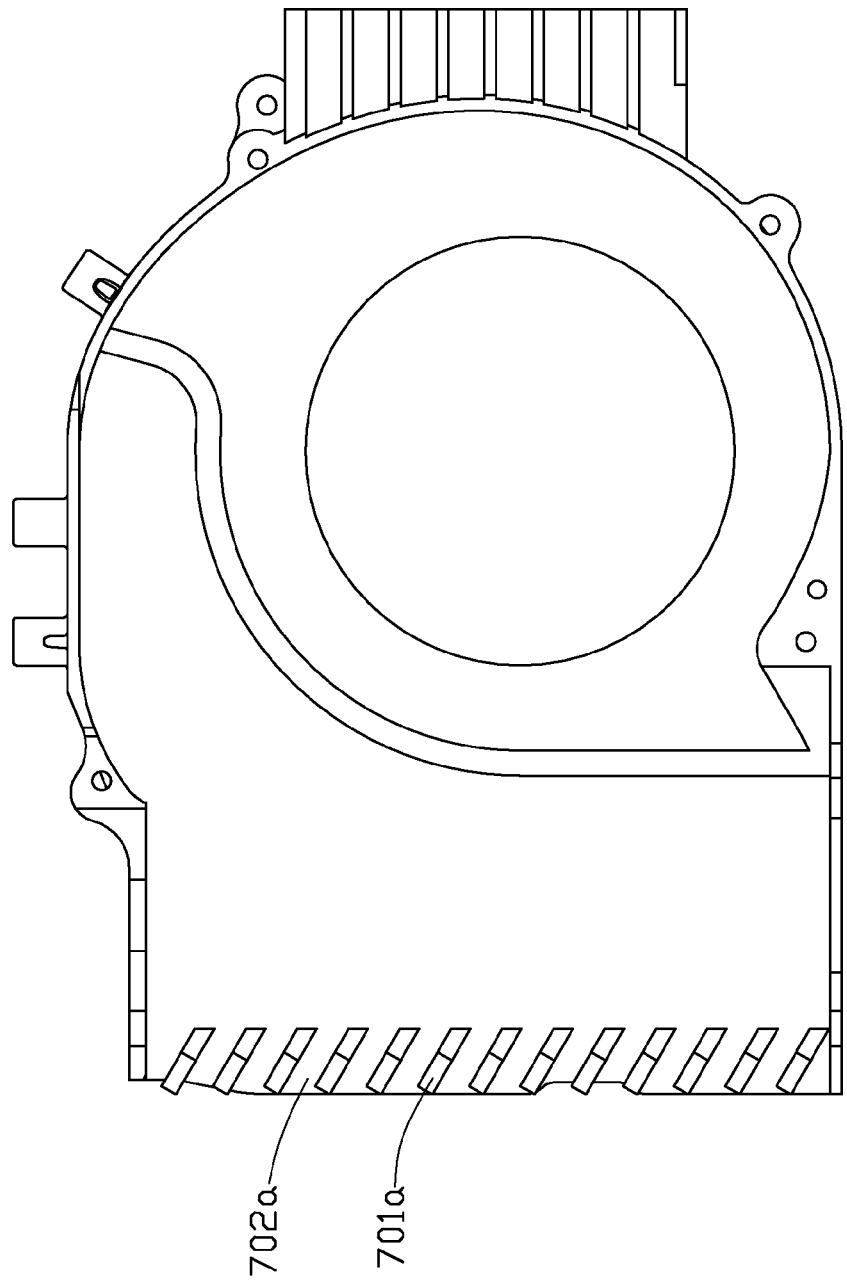
FIG. 7 is a top-down view of the bottom housing of FIG. 6.

Referring to FIGS. 6 and 7, a second embodiment of a bottom housing 60a of the present thermal module is shown. The sub-fins 701a are different from the sub-fins 701 in the first embodiment. In this embodiment, a main body of the sub-fin 701a is deflected with an angle relative to a main body of the fin 401 of the fin assembly 40 and extends towards a rear of the electronic product. The airflow flowing through the air channels 702a of the sub-fins 701a is guided to the rear of the electronic product and thus prevents the airflow from directly flowing towards a user of the electronic product.

Figure 8:
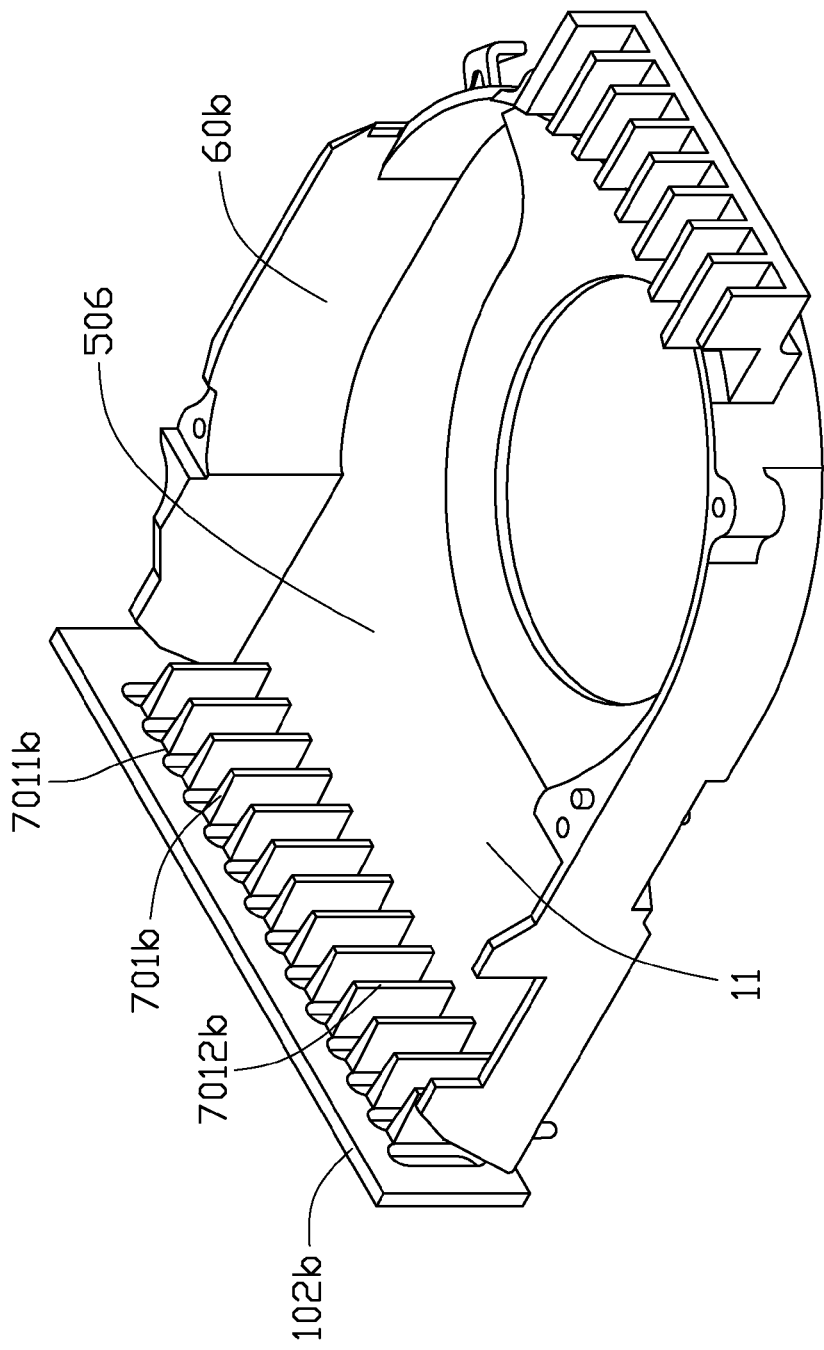
FIG. 8 is an isometric view of a bottom housing of a centrifugal blower according to a third embodiment of the present invention.

Referring to FIG. 8, a third embodiment of a bottom housing 60b of the present thermal module is shown. The sub-fins 701b and the sidewall 102b of the casing 10 of the electronic product are different from the sub-fins 701 and the sidewall 102 of the casing 10 in the first embodiment. In this embodiment, the sidewall 102b of the casing 10 of the electronic product is oriented substantially perpendicular to the base wall 11 of the casing 10 and the outer side 7011b of the sub-fin 701b is accordingly oriented perpendicular to the base wall 506 of the bottom housing 60b of the centrifugal blower 50. A thickness of the sub-fin 701b gradually decreases from the outer side 7011b of the sub-fin 701b towards the inner side 7012b thereof.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A thermal module comprising:
    a centrifugal blower having a bottom housing defining an air outlet therein;
    a fin assembly disposed at the air outlet of the centrifugal blower and having a plurality of fins forming a plurality of air passages therebetween; and
    a plurality of sub-fins integrally formed with the bottom housing of the centrifugal blower from a single piece, each of the sub-fins having an inner side connecting with corresponding said fin of the fin assembly and an outer side distant from the fin assembly, a plurality of air channels being formed between adjacent sub-fins and communicating with the air passages of the fin assembly.

2. The thermal module as described in claim 1, wherein the inner side of each sub-fin is perpendicular to a base wall of the bottom housing of the centrifugal blower, whilst the outer side of each sub-fin forms an acute angle with the base wall of the bottom housing of the centrifugal blower.

3. The thermal module as described in claim 1, wherein the inner side and the outer side of each sub-fin are both oriented perpendicular to a base wall of the bottom housing of the centrifugal blower.

4. The thermal module as described in claim 1, wherein a main body of each sub-fin is deflected with an angle relative to a main body of corresponding said fin of the fin assembly.

5. The thermal module as described in claim 1, wherein a thickness of each sub-fin gradually decreases from the outer side towards the inner side thereof.

6. The thermal module as described in claim 1, further comprising a heat pipe having an evaporating portion adapted for thermally connecting with a heat-generating electronic component and a condensing portion thermally engaging with the fin assembly.

7. The thermal module as described in claim 1, wherein a width of each air channel of the sub-fins gradually increases from an outer side towards an inner side thereof.

8. An electronic assembly comprising:
a casing of an electronic product having a base wall and a sidewall connected with the base wall, the sidewall defining a plurality of slots therein and comprising a plurality of barriers alternating with the slots; and
a thermal module disposed in the casing of the electronic product and comprising:
a centrifugal blower having a bottom housing defining an air outlet facing towards the slots of the sidewall;
a fin assembly disposed at the air outlet of the centrifugal blower, the fin assembly comprising a plurality of fins and having a plurality of air passages formed between adjacent fins; and
a plurality of sub-fins located between the fin assembly and the sidewall of the casing of the electronic product, and forming a plurality of air channels therebetween, wherein the air channels of the sub-fins communicate the air passages of the fins of the fin assembly with the slots of the sidewall of the casing.

9. The electronic assembly as described in claim 8, wherein the bottom housing of the centrifugal blower and the casing of the electronic product are integrally formed from a single piece.

10. The electronic assembly as described in claim 8, wherein the sub-fins and the bottom housing of the centrifugal blower are integrally formed from a single piece.

11. The electronic assembly as described in claim 8, wherein the sub-fins and the bottom housing of the centrifugal blower are separately formed and then connected together.

12. The electronic assembly as described in claim 8, wherein each of the sub-fins has an inner side disposed adjacent to the fins of the fin assembly and an outer side distant from the fin assembly and adjacent to the barriers of the casing of the electronic product.

13. The electronic assembly as described in claim 12, wherein a thickness of the outer side of each sub-fin equals a width of each barrier of the casing of the electronic product.

14. The electronic assembly as described in claim 12, further comprising a heat pipe having an evaporating portion adapted for thermally connecting with a heat-generating electronic component of the electronic assembly and a condensing portion thermally engaging with the fin assembly.

15. The electronic assembly as described in claim 12, wherein a width of each air channel gradually increases from the outer side towards the inner side thereof.

16. The electronic assembly as described in claim 12, wherein the sidewall of the casing is perpendicular to the base wall of the casing, whilst the outer side of each sub-fin is perpendicular to a base wall of the bottom housing of the centrifugal blower.

17. The electronic assembly as described in claim 12, wherein the sidewall of the casing forms an acute angle to the base wall of the casing, whilst the outer side of each sub-fin forms an acute angle, which essentially equals the acute angle formed between the sidewall and the base wall of the casing.

18. The electronic assembly as described in claim 8, wherein a width of each slot equals a width of an outer end of each air channel of the sub-fins, whilst a width of an inner end of each air channel equals a multiple of a width of each air passage of the fins of the fin assembly.

19. A thermal module comprising:
a centrifugal blower having a bottom housing defining an air outlet therein and a rotor rotatably mounted on the bottom housing and configured for generating an airflow through the air outlet;
a fin assembly disposed at the air outlet of the centrifugal blower and having a plurality of fins forming a plurality of air passages therebetween;
a plurality of sub-fins on the bottom housing of the centrifugal blower, each of the sub-fins having an inner side adjacent to the fin assembly and an outer side distant from the fin assembly, a plurality of air channels being formed between adjacent sub-fins and communicating with the air passages of the fin assembly, wherein the air channels each have a width larger than that of each of the air passages; and
a heat pipe having an evaporating portion adapted for thermally connecting with a heat-generating electronic component and a condensation portion thermally engaging with the fin assembly.

* * * * *